United States Patent [19]

Feuerstein et al.

[11] Patent Number: 4,740,385

[45] Date of Patent: Apr. 26, 1988

[54] APPARATUS FOR PRODUCING COILS FROM FILMS OF INSULATING MATERIAL, CONDUCTIVELY COATED IN A VACUUM

[75] Inventors: Albert Feuerstein, Neuberg; Helmut Eberhardt, Gründau; Helmut Lämmermann, Alzenau; Volker Bauer, Neuberg; Gerald Löbig, Frankfurt am Main, all of Fed. Rep. of Germany

[73] Assignee: Leybold-Heraeus GmbH, Cologne, Fed. Rep. of Germany

[21] Appl. No.: 19,072

[22] Filed: Feb. 26, 1987

[30] Foreign Application Priority Data

Dec. 6, 1986 [DE] Fed. Rep. of Germany ....... 3641718

[51] Int. Cl.$^4$ ............................................... B05D 3/06
[52] U.S. Cl. ........................................ 427/38; 427/40; 427/42; 427/116; 427/124; 427/177; 427/296; 427/350

[58] Field of Search ...................... 427/38, 40, 42, 116, 427/124, 177, 296, 350

[56] References Cited

U.S. PATENT DOCUMENTS

| | | | |
|---|---|---|---|
| 4,393,091 | 7/1983 | Shinohara et al. | 427/13 |
| 4,495,242 | 1/1985 | Arai et al. | 428/336 |
| 4,581,245 | 4/1986 | Nakamura et al. | 427/40 |

*Primary Examiner*—Bernard D. Pianalto
*Attorney, Agent, or Firm*—Felfe & Lynch

[57] ABSTRACT

A method and apparatus are disclosed for producing rolls or coils of film of insulating material which has been conductively coated, in a vacuum, by vaporizing conductive material in direct electron beam bombardment and condensing the vapor on the film surface. According to the invention, the film is subjected to a plasma treatment after coating and before the film is wound in a coil.

5 Claims, 1 Drawing Sheet

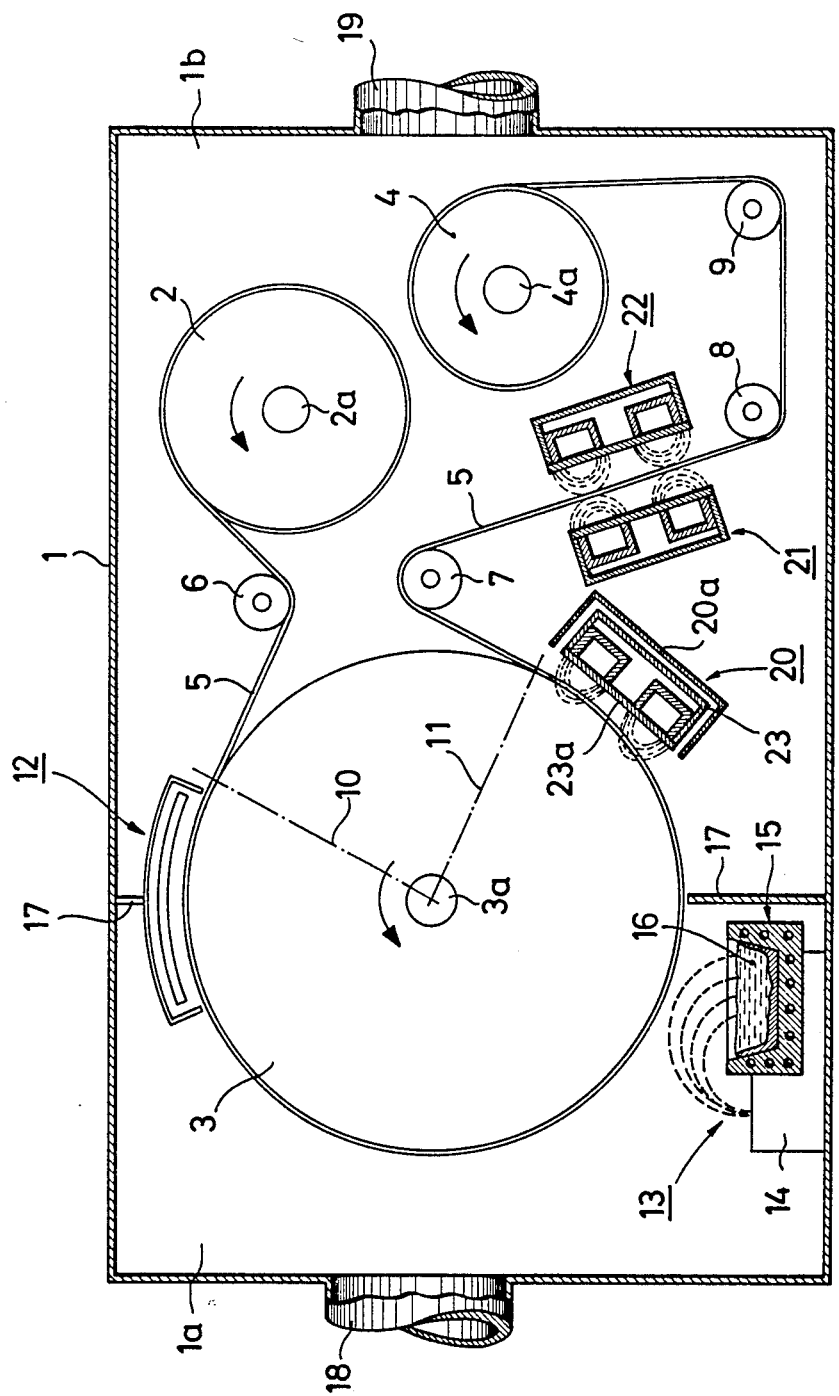

APPARATUS FOR PRODUCING COILS FROM FILMS OF INSULATING MATERIAL, CONDUCTIVELY COATED IN A VACUUM

BACKGROUND OF THE INVENTION

The invention relates to a method for producing rolls or coils from films of insulating material coated under vacuum with electrically conductive material. The film is guided at a specified angle of contact over a roller rotating with the roller and coating the film during its contact with the roller by vaporizing the conductive material by direct electron beam bombardment and condensing the vapor on the film surface. After this procedure the coated film is coiled up on a take-up drum.

The method referred to above is known from the German published patent application No. 3,420,245. The film of insulating material is made from a synthetic thermoplastic material; the electrically conductive material is a metal alloy of a magnetic material, such as a cobalt-nickel alloy. Magnetic tapes for audio and video recordings, for example, are produced by this known method.

This method of producing coated films is suitable not only for use with such films of insulating material in conjunction with electrically conductive magnetic materials, but also for the production of so-called capacitor films, which comprise a substrate of thermoplastic film and an aluminum layer. Neither the film material nor the electrically conductive coating sets limits to the range of applications of the inventive method.

With such a method, the handling of the film on its path from the coating source, that is, the electron beam vaporizer—to the take-up drum proves to be especially problematical. First of all, the film must be pulled from the roller, which frequently is also referred to as a cooling roller or a vapor-deposition roller, with the expenditure of not inconsiderable forces, because negative charge carriers, which bring about electrostatic charges, are implanted in the film by the vapor-deposition process, so that the film adheres to the roller due to electrostatic forces. Admittedly, this may be considered a positive feature insofar as the electrostatic "suction" promotes the heat dissipation to the roller and thus the cooling of the film. On the other hand, however, it leads to considerable coiling problems, because the tensile stress produced by the effect described leads to extremely undesirable fold formation in the film. The tendency to form folds increases wih the following parameters:

increasing voltage of the electron beam,
increasing film width,
increasing number of deflector rolls,
decreasing film thickness, and
increasing temperature difference (quenching effect).

An attempt has already been made to produce a stretching effect in the transverse direction of the film with curved deflector rolls (the so-called "banana rolls") and, by so doing, to counteract the formation of folds. This measure also has only a very limited effect.

The absence of the electrically conductive coating at the two side edges of the film has a particularly disavantageous effect. These two coating-free edge strips—as well as the uncoated center strip—are required for capacitor films; they are, however, also especially desirable so as not to coat the length of roller which necessarily projects beyond the film, since this would lead to an edge bead that becomes increasingly thicker. The uncoated edge strips have a particularly disadvantageous effect during the build-up of the coil, and moreover, as the coil diameter increases, the build-up of a regular edge bead with a partial doubling over of the film may be observed. It has hitherto not been possible to eliminate this effect, so that only a coil with a limited diameter could be produced.

Electrons may be regarded as the cause of the formation of folds and of the so-called edge beads on the coil. These electrons are reflected from the surface of the material to be vaporized from the so-called bath mirror, and have energies up to the energy of the electron beam. They are implanted in the film and can charge this film up to a voltage of 30 kV. This charge causes the film to "adhere" not only to the vapor-deposition roller, but also to the subsequent deflector rolls. On the finished coil, this charge also leads to an attraction of the adjacent coil layers in the region of the conductive coating. It may be assumed that the cause of this attraction is a polarization within the coated film. This attraction prevents the gliding process of the individual film layers over one another, which is necessary for a fold-free coil. On the other hand, when uncoated edge strips are present, repulsion of the individual film layers takes place in the region of these strips and finally leads to the above-described build-up of an edge bead in the coil.

SUMMARY OF THE INVENTION

It is therefore an object of the present invention to provide a coiling method of the initially described type, with which fold formation largely does not take place or at least is highly suppressed and with which the aforementioned edge bead does not develop, especially not on the coil.

This objective is accomplished, in accordance with the invention, by subjecting the coated film to a plasma treatment on its way to the take-up drum.

The expression "coated film" implies that this plasma treatment is carried out following the electron beam vaporizer in the running direction of the film.

The plasma treatment quite obviously produces a very extensive, if not complete decay of the electrostatic charge, so that (1) the film can be pulled without difficulty from the vapor-deposition roll as well as from the subsequent deflector rolls and that (2) the necessary but slight cross movements can also be carried out on the coil, as it is in the process of being built-up, as a result of which fold formation is prevented. In particular it has turned out that the undesirable edge bead is not built up on the coil with the inventive plasma treatment.

The plasma treatment may be carried out at any place in the path of the film before the film runs up on the coil. It is, moreover, possible to expose the film on the coating side, on the rear side or on both sides to the plasma treatment. It is even possible to treat the film with the plasma only in its two edge regions, either on the front or the rear side or on both sides.

It is, however, particularly advantageous if the plasma treatment is carried out at the end of the angle of contact, especially if the plasma treatment is carried out before the film is pulled from the roller. In this case, namely, the electrostatic "adhesion" to the vapor-deposition roll is nullified in a timely manner, so that an excessive tensile stress at the film is precluded.

Various devices come into consideration as a plasma source: for example, disk-shaped electrodes, which are flat or curved concentrically with the vapor-deposition roll and which are connected to a negative voltage of between 500 and 5,000 volts. The voltage may be a direct-current voltage, an alternating-current voltage or a high frequency voltage. The material, preferably used for the electrode, is one which is not atomized readily, such as aluminum or high-grade steel. It is, however, particularly advantageous to use a so-called magnetron cathode, in which a closed tunnel of lines of magnetic flux is formed over a plate of a metal that is not readily atomized. In principle, such an arrangement is well known from so-called sputtering cathodes. Such magnetrons are described, for example, in the German published patent application No. 2,243,798. They may likewise be supplied either with direct-current voltage, an alternating-current voltage or with a high frequency voltage. When a magnetron cathode is used, the voltage can be limited to values between −300 and −800 volts.

It is, moreover, advisable to ensure that the plamsa contacts the surface of the film. Since in the case of a magnetron cathode the plasma is held in the vicinity of the cathode by the magnetic tunnel, the magnetron cathode must be brought closer to the film than a cathode without magnetic field support.

The specific wattage, based on the effective cathode surface, is advisably selected to be between 0.1 and 5 watt/cm$^2$ and typically at about 2.5 watt/cm$^2$. The residence time, during which the film passes through the plasma, is advisably selected to be between 0.2 and 10 milliseconds.

The invention also relates to equipment for implementing the inventive process. Such equipment has a feed drum, a roller disposed above the electron beam vaporizer and looped by the film and a take-up roll, as well as deflector rolls for establishing a path for the film.

To accomplish the same objective, at least one plasma source is disposed pursuant to the invention in the region of the path of the film from the electron beam vaporizer to the take-up drum. This plasma source is so oriented towards the path of the film, that the plasma contacts the film.

For a full understanding of the present invention, reference should now be made to the following detailed description of the preferred embodiment of the invention, taken in conjunction with the accompanying drawing.

BRIEF DESCRIPTION OF THE DRAWING

The single FIGURE is a cross-sectional, and partly schematic diagram of the apparatus, according to the present invention, for coating film of insulating material with electrically conductive material.

DESCRIPTION OF THE PREFERRED EMBODIMENTS

The FIGURE shows a vacuum chamber 1 in which a feed drum 2, a roller 3 (vapor-deposition roll), through which a coolant is flowing, and a take-up drum 4 are disposed parallel to the axis. The path of a film 5 is determined by the feed drum, the roller and the take-up drum, as well as by deflector rolls 6, 7, 8 and 9, it being understood that, because of the change in the diameter of the coil, the path of the film 5 between the feed drum 2 and the deflector roll 6, as well as between the deflector roll 9 and the take-up drum 4 is variable. In practical constructions, further deflector rolls are usually present. For the sake of simplicity, however, they have not been shown here. At least the take-up roll 4 is driven.

The angle of contact of the roller 3 is the larger angle between the two dot-dash lines 10 and 11. In the region of this angle of contact, there is first of all a glow-discharge device 12 for preparing or cleaning the film for the actual coating process. Such glow-discharge devices are state of the art and are therefore not described herein in detail.

Below the roller 3, there is an electron-beam vaporizer 13, which comprises an electron-beam gun 14 and a liquid-cooled vaporizer crucible 15. The vaporizer crucible has a rectangular recess, in which the fused vaporization material 16 is contained during the operation of the equipment. The upwards pointing opening of the crucible also is rectangular and its longest axis of symmetry runs perpendicular to the plane of the drawing and parallel to the axes of rotation 2a, 3a and 4a of the drums and the roller. Since the present case involves the vapor deposition of a magnetic material on the film 5, a normal (perpendicular) line, passing through the center of the crucible opening, is displaced transversely to the axis of rotation 3a, so that the desired angular vapor deposition takes place.

In the region of the roller 3, the vacuum chamber 1 is subdivided by a discontinuous partition 17, so that two partial chambers 1a and 1b are formed, which are linked over two vacuum connection pieces to the associated vacuum pumps. The partition serves the purpose that the outgassing of the film on the feed drum is restricted to the partial chamber 1b and that the vapor-deposition process is restricted to the partial chamber 1a.

Within the partial chamber 1b, three plasma sources 20, 21 and 22 are shown, which are constructed as so-called magnetrons and one of which suffices in the limiting case. As may be seen in the FIGURE, a grounding shield 20a is arranged to surround the plasma source 20. Such a shield is also present on the other plasma sources 21 and 22 but, for the sake of simplicity, has been omitted in the drawing. The plasma sources 20 to 22 each consist of a closed box 23, the front side 23a of which is oriented towards the film 5 and comprises a material with poor atomizing properties (aluminum, high-grade steel). The lines of flux of a closed magnetic tunnel, which are shown by broken lines, penetrate through this front side. As already stated, the mode of action of such a magnetic tunnel is described in the German published patent application No. 2,243,708.

The plasma source 20 is disposed at the end of the angle of contact preset on one side of the deflector roll 7. Moreover, the plasma source 20 is oriented with its plasma-generating electrode surface, the front side 23a, towards the axis 3a of the roller 3. Strictly speaking, the surface normal, passing through the center of gravity of the front side 23a, is oriented towards the axis 3a. As a result, the front side 23a runs tangentially to the immediately opposite surface section of roller 3 or to the partial length of film 5 on this section. The adhesive effect of the film 5 on the roller 3 is substantially or even completely eliminated by the plasma source 20 even before the film is lifted off the roller. The plasma sources 21 and 22 may be additionally present, either individually or in pairs; they may also be present alternatively or be omitted. In the limiting case, one of the plasma sources 20, 21 or 22 suffices. It can be seen that the path of the film leads through the magnetic fields of the plasma sources. In any case, the spatial adjustment is made so that plasma, held within the magnetic tunnel, reaches the film. With the usual design of such magnetrons, this is the case when the distance between the front side 23a and the film 5 is between 20 and 50 mm.

EXAMPLE 1: (Comparison Example)

In equipment like that shown in the FIGURE, a polyester film, 52 cm wide and 9–12 μm thick, was sputtered with a cobalt-nickel alloy in order to produce video tapes. The running speed of the film and thus the circumferential speed of the roller 3 was 100 m/min. The wattage of the electron beam vaporizer 13 was adjusted so that the thickness of the CoNi alloy layer on the film was 100 nm. Since none of the plasma sources 20 to 22 was put into operation here, a coil with many folds and with two strong edge beads, one at either end of the coil, resulted. The coiling process had to be terminated after the coil reached a diameter of 25 cm. The width of the uncoated edge at either side was about 1 cm.

EXAMPLE 2

The experiment of Example 1 was repeated, however with the difference that the plasma source 20, the length of which was larger by some centimeters than the width of the film 5, was supplied with a voltage of $-300$ volts. With this arrangement, the cathode current was 10 amps. At the same time, argon was supplied in such amounts to the partial chamber 1b, that an argon partial pressure of $5 \times 10^{-3}$ to $1 \times 10^{-2}$ mbar developed. The specific wattage of the magnetron, based on the surface area of the front side 23a, was 2.5 W/cm$^2$. A coil, practically completely free of folds, was formed on the take-up drum 4 and, in particular, no edge bead was formed on either side of the coil. It was possible to continue the build-up of the coil undisturbed up to a total diameter of 40 cm.

EXAMPLE 3

The experiment of Example 2 was repeated, however, with the difference that an aluminum layer for producing a capacitor film was sputtered on a polyethylene film 52 cm wide and 6 μm thick. The running speed of the film here was 480 m/min and the wattage of the electron beam vaporizer 13 was adjusted, so that a layer 350 nm thick resulted. The plasma source 20 was operated with the same parameters as in Example 2. However, because the running speed was higher by a factor of 4.8, a correspondingly shorter residence time of the film in the region of the plasma discharge of the plasma source 20 resulted. An edge region of 1 cm on both sides of the film was also kept free here of the aluminum coating. Here also, a largely fold-free coil was formed on the take-up drum 4 which, in particular, was also free of edge beads and it was possible to build up the coil undisturbed up to a diameter of 40 cm.

EXAMPLE 4

The experiment of Example 3 was repeated. However, to compensate for the reduction in the residence time in the region of the plasma source 20 due to the higher running speed of the film, additional plasma sources 21 and 22, with a specific wattage 1/5 of that of the plasma source 20, were placed into operation. Strictly optically, there resulted an even smoother build up of the coil on the take-up drum 4. However, the conditions in the edge region of the coil could not be improved further, since optimum results had already been achieved by the experiment described above in Example 3.

There has thus been shown and described a novel method and apparatus for conductively coating films of insulating material which fulfill all the objects and advantages sought therefor. Many changes, modifications, variations and other uses and applications of the subject invention will, however, become apparent to those skilled in the art after considering this specification and the accompanying drawing which disclose the preferred embodiment thereof. All such changes, modifications, variations and other uses and applications which do not depart from the spirit and scope of the invention are deemed to be covered by the invention which is limited only by the claims which follow.

We claim:

1. In a method for producing and coiling films of insulating material coated under a vacuum with electrically conductive material by guiding the film at a specified angle of contact over a roller rotating with the film and coating the film during its contact with the roller by vaporizing the conductive material by direct electron beam bombardment and condensing the vapor on the film surface and thereafter coiling up the coated film on a take-up drum, the coated film being exposed to a plasma treatment along its path to the take-up drum, the improvement wherein said plasma treatment is carried out at the end of the angle of contact with the roller, before the film is pulled off the roller, and the plasma treatment is carried out by means of a magnetron cathode, the plasma contacting the film.

2. The method defined in claim 1, wherein the plasma treatment is carried out only in the edge regions of the film.

3. The method defined in claim 1, wherein the plasma treatment is carried out at a specific wattage of 0.1 to 5 watt/cm$^2$ of the particular cathode surface which causes the formation of the plasma.

4. The method defined in claim 3, wherein the residence time of the film in the plasma during its passage through the plasma is 0.2 to 10 ms.

5. The method defined in claim 1, wherein the plasma treatment is carried out in a nonreactive atmosphere at a pressure between $5 \times 10^{-2}$ and $10^{-3}$ mbar.

* * * * *